(12) United States Patent
Berthet et al.

(10) Patent No.: US 7,127,009 B2
(45) Date of Patent: Oct. 24, 2006

(54) METHOD OF CODING/DECODING A DIGITAL DATA STREAM CODED WITH BITWISE INTERLEAVING IN MULTIPLE TRANSMISSION AND RECEPTION IN THE PRESENCE OF INTERSYMBOL INTERFERENCE AND CORRESPONDING SYSTEM

(75) Inventors: Antoine Berthet, Chatenay-Malabry (FR); Raphaël Visoz, Issy-les-Moulineaux (FR)

(73) Assignee: France Telecom, Paris (FR)

( * ) Notice: Subject to any disclaimer, the term of this patent is extended or adjusted under 35 U.S.C. 154(b) by 768 days.

(21) Appl. No.: 10/119,097

(22) Filed: Apr. 9, 2002

(65) Prior Publication Data

US 2002/0186800 A1 Dec. 12, 2002

(30) Foreign Application Priority Data

Apr. 12, 2001 (FR) .................................. 01 05037

(51) Int. Cl.
*H04L 27/06* (2006.01)
(52) U.S. Cl. .................................................... 375/341
(58) Field of Classification Search ................ 375/341, 375/259, 343, 265, 347, 349, 267
See application file for complete search history.

(56) References Cited

U.S. PATENT DOCUMENTS 6,683,915 B1 * 1/2004 Trott et al. .................. 375/262
6,898,248 B1 * 5/2005 Elgamal et al. ............. 375/259
6,904,107 B1 * 6/2005 Rached et al. .............. 375/343

OTHER PUBLICATIONS

Tonello. "Space-time bit interleaved coded modulation over frequency selective fading channels with iterative decoding"—Proceedings of Global Telecomm. Conf. GLOBECOM'00—vol. 3—Nov. 27, 2000-Dec. 1, 2000, pp. 1610-1620. San Francisco, CA, USA.
Boutros et al. "Bit interleaved coded modulations for multiple-input multiple-output channels"—Proc. of International IEEE Symposium on spread spectrum techniques and applications—vol. 1, Sep. 6-8, 2000—pp. 123-126.

(Continued)

*Primary Examiner*—Khanh Tran
*Assistant Examiner*—Sam K. Ahn
(74) *Attorney, Agent, or Firm*—Patzik, Frank & Samotny Ltd.

(57) ABSTRACT

Method and system for coding/decoding a digital data stream coded with bitwise interleaving in multiple transmission and reception for a radio interface, in which the coding includes subjecting an initial digital data stream to an outer coding, an interleaving, a layer demultiplexing on multiple pathways, converting by modulation successive bits of each layer into $Q_m$-ary symbol then transmitting each symbol by means of a transmission antenna of an array of antennas and the decoding includes receiving the digital data stream transmitted on multiple r reception antennas forming an array, subjecting the set of symbols received to an iterative process of equalization and joint multilayer detection, on the basis of an a priori information item, subjecting the first extrinsic information stream obtained to a deinterleaving, subjecting a second extrinsic information stream obtained to an outer decoding and a third extrinsic information stream obtained to an interleaving so as to generate the a priori information item and reinjecting the latter into the process.

11 Claims, 7 Drawing Sheets

OTHER PUBLICATIONS

Stefanov et al. "Turbo coded modulation for systems with transmit and receiev antenna diversity"—1999 IEEE Global Telecommunications Conf. GLOBECOM'99. Seamless Interconnection for Universal Services. Rio de Janeiro, Brazil, Dec. 5-9, 1999 IEEE Global Telecomm. Conf. New-York, NY: IEEE, US—vol. 5, Dec. 5, 1999, pp. 2336-2340.

Bauch et al. "Iterative equalization and decoding with channel shortening filters for space-time coded modulation"—Vehicular Technology Conf. Fall 2000—IEEE VTS Fall VTC2000—vol. 4, Sep. 24-28, 2000, pp. 1575-1582.

Su et al. "Space-time turbo codes with full antenna diversity"—IEEE Trans. on Communications. vol. 49, No. 1 Jan. 2001. pp. 45-57.

Zehavi E. "8-PSK trellis codes for a Rayleigh channel"—IEEE Trans. on Communications. vol. 40, No. 5, 1992.

G.Caire et al. "Bit interleaved coded modulation"—IEEE Trans. Inform. Theory, vol. 44, No. 3, pp. 927-946, May 1998.

X.Li, J.A. Ritcey "Trellis-coded modulation with bit-interleaving and iterative decoding"—IEEE ISAC, vol. 17, No. 4, pp. 715-725, Apr. 1992.

R.Visoz et al. "Joint equalization and decoding of trellis-encoded signals using the generalized Viterbi algorithm"—IEEE VTC 2000 ,Boston, USA.

G.Bauch, V.Franz. "A comparison of soft-in soft-out algorithm for turbo-detection" Proceedings of ITC, vol. 2 pp. 259-263, Portos-Carras, Greece, Jun. 1998.

J.Hagenauer, P.Hoeher, "A Viterbi algorithm with soft-decision outputs and its applications", Proc. IEEE GLOBECOM'89, pp. 1680-1686, Dallas, USA, Nov. 1989.

T. Hashimoto. "A list-type reduced-constraint generalization of the Viterbi algorithm" IEEE Trans. on Information Theory. vol. IT-33, No. 6, Nov. 1987, pp. 866-876.

\* cited by examiner

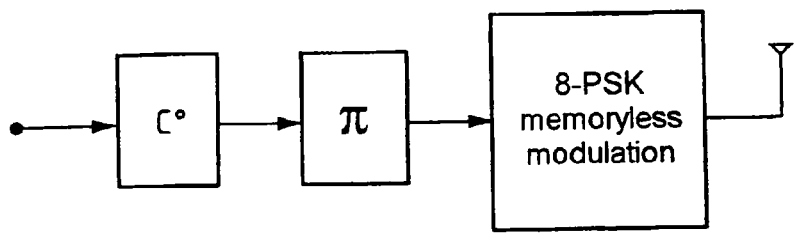
**FIG. 1a : (Prior art)
Rayleigh channel**
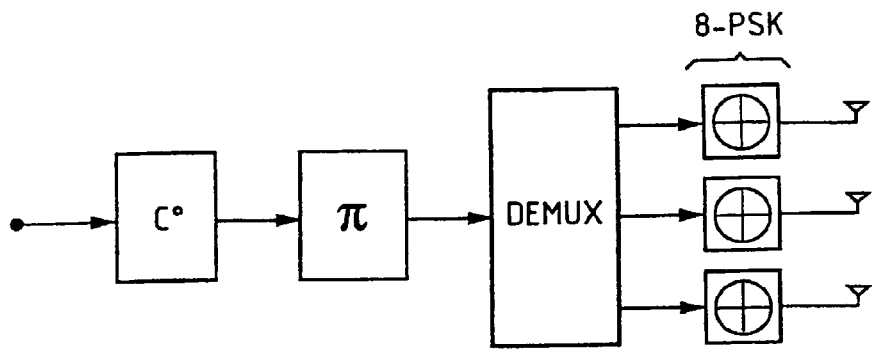
**FIG. 1b : (Prior art)
Rayleigh channel**
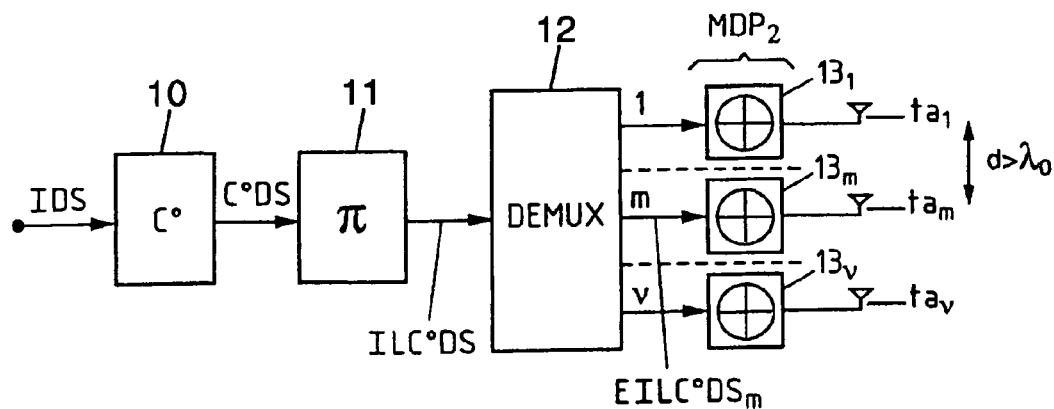
FIG. 4a

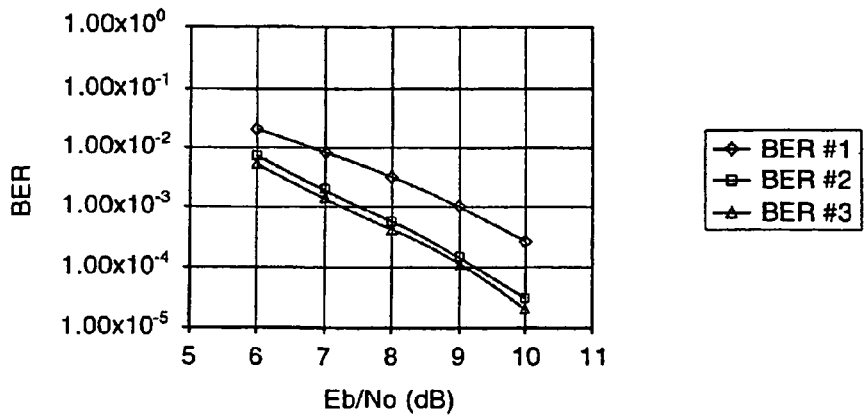
FIG. 5a : Process according to figure 1a (prior art)
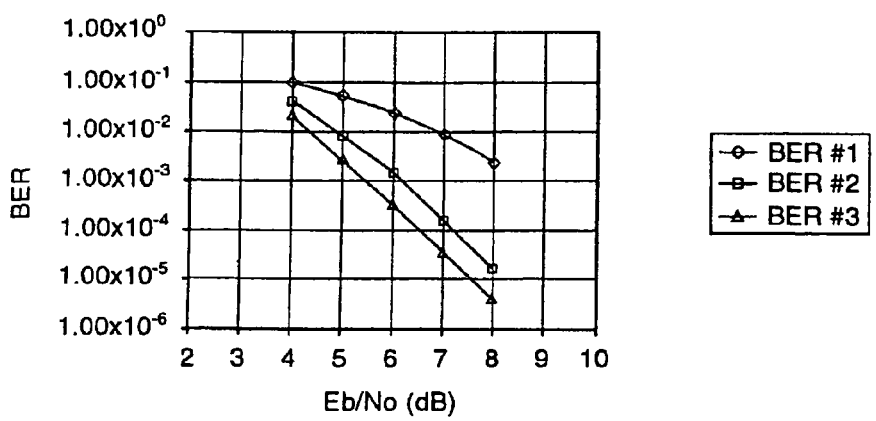
FIG. 5b : Process according to the invention: $v=3$
Coding according to figure 2
Decoding according to figure 3a

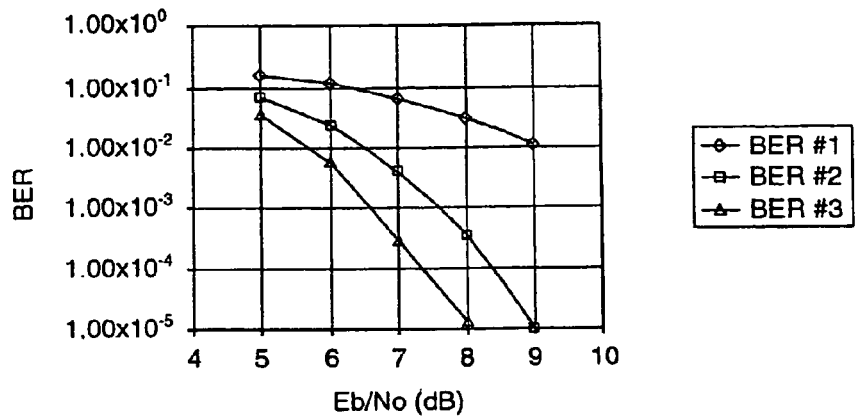
FIG. 5c : Process according to the invention: $v=4$
Coding according to figure 2
Decoding according to figure 3a
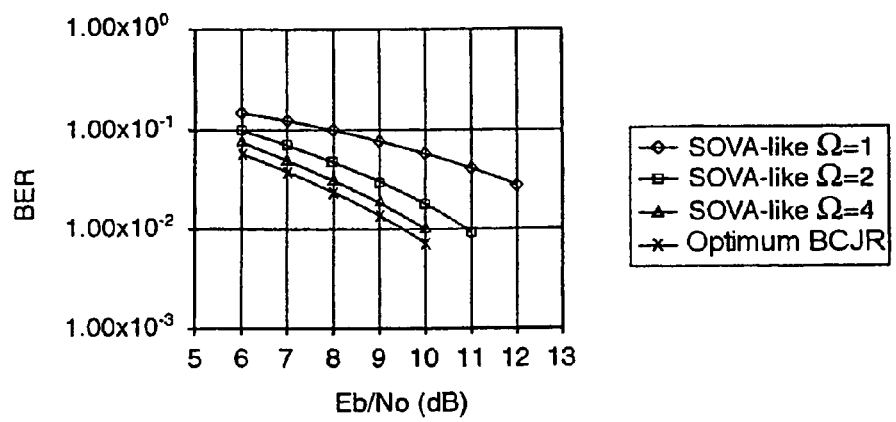
FIG. 5d : Process according to the invention as a function of the number of survivors $\Omega$
Coding according to figure 2
Decoding according to figure 3a

METHOD OF CODING/DECODING A DIGITAL DATA STREAM CODED WITH BITWISE INTERLEAVING IN MULTIPLE TRANSMISSION AND RECEPTION IN THE PRESENCE OF INTERSYMBOL INTERFERENCE AND CORRESPONDING SYSTEM

This application claims the benefit of earlier filing date and right of priority to French Patent Application Number FR 01 05037, filed Apr. 12, 2001.

FIELD OF THE INVENTION

The invention relates to a method of coding/decoding a digital data stream coded with bitwise interleaving in multiple transmission and reception in the presence of intersymbol interference and a corresponding system.

BACKGROUND OF THE INVENTION

More specifically, the method of coding/decoding and the system, which are the subjects of the invention, are more especially adapted to the implementation of high or very high bit rate radiofrequency transmission systems usable within the framework of mobile telephony or, as appropriate, in the field of radiofrequency links between electronic apparatus, in any environment, especially harsh.

In the aforementioned fields of application, the transmission of digital data with a high degree of reliability and security comes up against a major obstacle, that of the transmission of these data by way of a variable transmission channel whose characteristics are not known a priori. The digital data transmitted are subdivided into symbols, consisting of strings of bits of these data, each symbol allowing the modulation of a carrier radio wave transmitted over the channel.

The very strong demand for reliable high bit rate radiofrequency transmission processes has brought about the initiation and execution of numerous research projects relating to the definition and implementation of future-generation TDMA (Time Division Multiple Access) mobile radio communication systems.

Radiofrequency transmission channels are known by the fact that they are both frequency selective and time varying. The temporal variation is consequent upon the mobility or the speed of the user or users. Their frequency selectivity results from the conditions of propagation of the radiofrequency signals via multiple paths and the destructive superposition of the signals received, arising from propagations over these various paths. The phenomenon of frequency selectivity brings about a phenomenon of intersymbol interference, prejudicial to the quality of transmission and detection of these symbols upon reception thereof. The phenomenon of intersymbol interference and the complexity of the receivers are substantially heightened with the transmission bit rate.

These specific characteristics of the above-cited radiofrequency transmission channels have always led to the implementation of particularly subtle tailored radiofrequency interfacing systems, all the more so when high bit rate transmission with high spectral efficiency is sought.

Nevertheless, the aforesaid frequency selectivity and temporal variation, regarded a priori as major obstacles, of radiofrequency transmission channels have however been the subject hitherto of investigations, by way of the concept of diversity, as will be explained hereinbelow.

Among the aforesaid projects and developments, the process of coded modulations with bitwise interleavings, also referred to as Bit Interleaved Coded Modulations or BICM, have been known for around ten years.

In general, as described hereinbelow with reference to FIG. 1a, these processes consist in applying to an original digital stream an outer code, $C°$, followed by an interleaving, $\pi$, on the bits of a block of specified length in terms of number of bits, then a GRAY modulation. For a more detailed description of these processes, reference may usefully be made to the article entitled "8-*PSK Trellis Codes for a Rayleigh Channel*", published by Ephraim ZEHAVI, IEEE Transactions on Communications, vol. 40, No. 5, 1992.

The processes of this type have recently formed the subject of new theoretical or practical studies. Among the aforesaid studies, mention may be made of those published by G. CAIRE, G. TARICCO and E. BIGLIERI entitled "*Bit Interleaved Coded Modulation*", IEEE Trans. Inform. Theory, vol. 44, No. 3, pp. 927–946, May 1998 and by X. LI and J. A. RITCEY entitled "*Trellis-Coded Modulation with Bit-Interleaving and Iterative Decoding*", IEEE ISAC, vol. 17, No. 4, pp. 715–725, April 1992.

More recently, the aforesaid studies have been generalized to a system with multiple antennas in transmission and reception.

Such a process, which is more elaborate, corresponds to the illustrative scheme as represented in FIG. 1b in which the demultiplexing on a given number of pathways, after the interleaving process, makes it possible to implement the multiple transmission process, as is represented in the aforesaid figure.

Such a process is essentially implemented for a Rayleigh channel, that is to say for a transmission channel for which the memory effect is almost absent, i.e. in the absence of any intersymbol interference phenomenon.

Such a process cannot therefore easily be implemented in a real environment in which the intersymbol interference phenomenon is always present, in particular within the framework of high or very high bit rate transmissions, the conditions of high or very high bit rate transmission having the effect of greatly increasing the aforesaid intersymbol interference phenomenon, by reason of the aforesaid memory effect. For a more detailed description of the abovementioned process, reference may usefully be made to the article entitled "*Bit-Interleaved Coded Modulations for Multiple-Input Multiple Output Channels*" published by J. J. BOUTROS, F. BOIXADERA, C. LAMY, IEEE 6th Int. Sum. on Spread Spectrum Tech. & Appli. NSIT New Jersey, USA, Sep. 6-6, 2000, and to the article entitled "*Turbo Coded Modulation for Systems with Transmit and Receive Antenna Diversity*" published by Andrej STEFANOV, Tolga M. DUMAN, Telecommunications Research Center, Electrical Engineering Department, Arizona State University, Tempe, Ariz. 85287-7206, Global Telecommunications Conference—Globecom 99.

The technique implemented according to the aforesaid process thus has the major drawback of not supporting the frequency selectivity of the elementary transmission channels, from transmission antenna to reception antenna, constituting the global transmission channel. Stated otherwise, the aforesaid technique appears unsuited to the implementation of a correction of the intersymbol interference phenomenon.

An advantageous coding has recently been proposed which implements radiofrequency interfaces, making it possible to guarantee high spectral efficiency, in the publication: "*Space-Time Bit-Interleaved Coded Modulation over Fre-* quency Selective Fading Channels with Iterative Decoding", by A. M. TONELLO, GLOBECOM 2000, vol. 3, pages 1616–1620, San Francisco, USA, November 2000. However, the coding/decoding principles stated in this publication, although promising, make provision, on reception, for operations of multilayer detection and intersymbol interference decoding, on the one hand, and of outer decoding, on the other hand, in a disjoint and iterative manner, while making use of optimal algorithms. A decoding system based on such a principle is of great complexity and difficult to implement, in practice.

OBJECTS OF THE INVENTION

The present invention is aimed at a method of and a system for decoding a digital data stream coded with bitwise interleaving in multiple transmission and reception in the presence of intersymbol interference.

The object of the decoding process and system, within the meaning of the present invention, is to remedy the drawbacks and alleviate the inadequacies of the prior art processes and techniques.

In particular, the decoding method and system, which are the subjects of the present invention, are more especially suited to the implementation of radiofrequency interfaces making it possible to guarantee high spectral efficiency.

An object of the present invention is to provide a method of and a system for decoding a digital data stream coded with bitwise interleaving in multiple transmission and reception in the presence of intersymbol interference, which are at once simple in their implementation and robust.

Another object of the present invention is the implementation of a decoding method and system which are especially suited to the definition and to the embodiment of radiofrequency interfaces which are especially robust to highly frequency-selective transmission channels, or equivalently, which allow very efficient combating of the phenomenon of intersymbol interference.

Another object of the present invention is finally to provide a method of and a system for decoding digital data coded with bitwise interleaving in transmission and reception which are more especially suited to the implementation of radiofrequency interfaces making it possible to achieve very good performance in terms of frame and bit error rate for limited signal-to-noise ratio.

SUMMARY OF THE INVENTION

Within the meaning of the present invention, provision is made initially for a coding consisting in subjecting the digital data stream to an outer coding by means of a code of specified rate, so as to generate a coded digital stream, subjecting this coded digital stream to an interleaving at bit level so as to generate an interleaved coded digital stream, subjecting this interleaved coded digital stream to a layer demultiplexing on a specified number ν of demultiplexed pathways, so as to generate a corresponding number of layers of interleaved coded digital stream, converting each digital modulation string consisting of $q_m$ successive bits of one and the same layer into a $Q_m$-ary symbol, $Q_m = 2^{q_m}$, with $m \in [1, \nu]$, according to a specific mapping scheme, transmitting each $Q_m$-ary symbol by means of a distinct transmission antenna, the set of these antennas forming a space-diversity array so as to generate a set of transmitted elementary digital streams. This operational process makes it possible, on reception, to perform a decoding of the set of transmitted elementary digital streams, on the basis of an a priori information item on the constituent coded bits of the coded digital stream.

The method of and the system for decoding a digital data stream coded with bitwise interleaving in multiple transmission and reception on a transmission channel creating intersymbol interference, in accordance with the method or by virtue of the aforesaid coding system, which are the subjects of the present invention, comprises the steps of, respectively entails receiving, on a plurality ρ of reception antennas, this digital data stream coded with bitwise interleaving in multiple transmission and reception consisting of this set of elementary digital streams transmitted on this transmission channel, there being a number ρ of these reception antennas, which number is independent of the number ν of transmission antennas and these reception antennas forming an array of space-diversity reception antennas so as to define a set of elementary streams of modulation symbols received, subjecting this set of elementary streams of modulation symbols received to an iterative process of equalization of the transmission channel and of joint multilayer detection by means of an extrinsic information stream on the bits coded by this outer code and interleaved, this extrinsic information stream constituting an a priori information item, so as to generate a first extrinsic information stream on the bits coded by the outer code and interleaved, subjecting the first extrinsic information stream to a deinterleaving, so as to generate a second extrinsic information stream on the coded bits originating from the equalization process, subjecting this second extrinsic information stream on the coded bits to a decoding on the basis of the outer code, so as to generate a third extrinsic information stream on the coded bits, which stream arises from the decoding on the basis of the outer code, subjecting this third extrinsic information stream to an interleaving, so as to generate the extrinsic information stream on the bits coded by the outer code and interleaved constituting this a priori information item, reinjecting this a priori information item into the iterative process of equalization of the transmission channel and of joint multilayer detection.

The method of and the system for decoding a digital data stream coded with bitwise interleaving in multiple transmission and reception in the presence of intersymbol interference, which are the subjects of the present invention, find application not only to mobile radiotelephony but also to the implementation of radiofrequency interfaces between electronic apparatus of any type, in a domestic or industrial environment.

BRIEF DESCRIPTION OF THE DRAWINGS

They will be better understood on reading the following description and on looking at the drawings in which:

FIGS. 1a and 1b relate to prior art processes;

FIG. 4a represents, by way of illustration, a functional scheme of a system for coding a digital data stream coded with bitwise interleaving in multiple transmission and reception in the presence of intersymbol interference, within the meaning of the present invention;

FIG. 4b represents, by way of illustration, a functional scheme of a system for decoding, which is the subject of the present invention, a coded digital data stream with bitwise interleaving in multiple transmission and reception in the presence of intersymbol interference, in accordance with the coding method illustrated in FIG. 2 and by means of the coding system represented in FIG. 3a;

FIG. 5a represents, by way of illustration, a chart of the value of the bit error rate as a function of the signal-to-noise ratio during the implementation of a prior art coding process illustrated in FIG. 1a, a BCJR equalization on the basis of a 64-state trellis being applied so as to ensure the decoding;

FIG. 5b represents, by way of illustration, a chart of the value of the bit error rate as a function of the signal-to-noise ratio during the implementation of the coding method, within the meaning of the present invention, as represented in FIG. 2, for a multiple transmission with three transmission antennas in two-state phase modulation $MDP_2$, the decoding being carried out in accordance with the decoding method which is the subject of the present invention by equalization and iterative joint detection of BCJR type;

FIG. 5c represents, by way of illustration, a chart of the value of the bit error rate as a function of the signal-to-noise ratio during the implementation of the coding method and of the decoding method which is the subject of the present invention, for a number of transmission antennas equal to 4;

FIG. 5d represents, by way of illustration, a comparative chart of the value of the bit error rate as a function of the signal-to-noise ratio during the implementation of the coding method and of the decoding method which is the subject of the present invention, the process of equalization and joint multilayer detection being a GPSP process consisting in retaining $\Omega$ survivors per node of the global reduced trellis, the calculation of the weighted outputs consisting of a process of generalized SOVA type, the comparative chart being established for various values of the number $\Omega$ of survivors with regard to a BCJR optimal process.

MORE DETAILED DESCRIPTION

A more detailed description of the method of coding digital data streams coded with a bitwise interleaving in multiple transmission and reception, within the meaning of the present invention, will now be given in conjunction with FIG. 2.

With reference to the aforesaid figure, it is indicated that the method of coding is applied to an initial data stream, denoted IDS, constituting a sequence of external data denoted $\{d_1, \ldots d_{r0}\}$, this sequence of external data corresponding to symbols consisting of successive bits, denoted $\underline{d}n = \{d_{n,1}, \ldots d_{n,k0}\}$.

It is recalled that for the transmission of coded digital data, subdivision of these digital data into symbols consisting of a certain specified number of successive bits makes it possible to ensure channel modulation with a view to the transmission of these symbols and, ultimately, of the data sequence consisting of the latter independently of any significant value of the sequence consisting of these successive bits.

Figure 2:
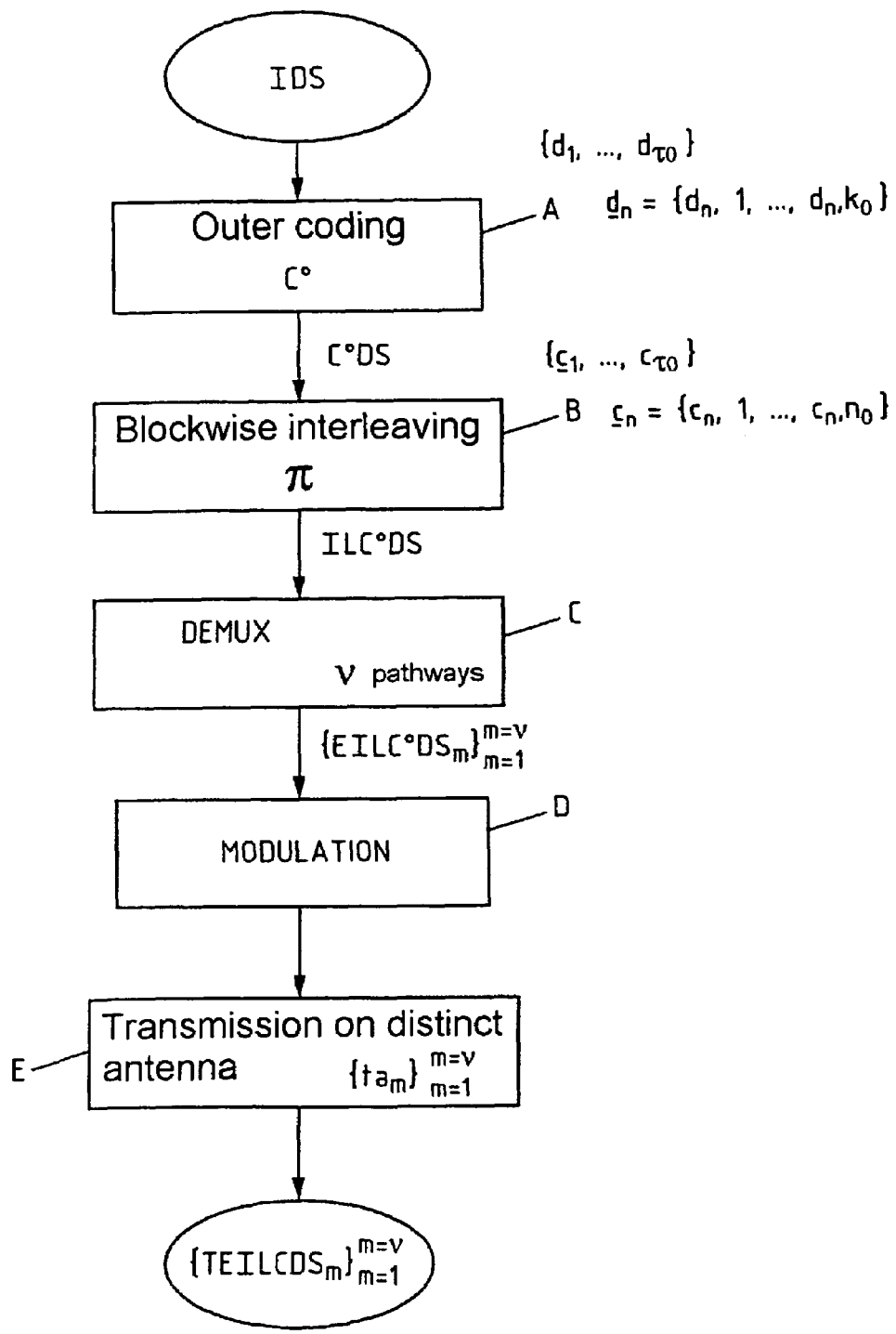
FIG. 2 represents, by way of illustration, a flowchart of the method of coding a digital data stream coded with bitwise interleaving in multiple transmission and reception in the presence of intersymbol interference, within the meaning of the present invention.

As will be observed in FIG. 2, the initial digital data stream IDS is subjected, in a step A, to an outer coding by means of a code of specified rate so as to generate a coded digital stream. In the aforesaid FIG. 1a, the code making it possible to perform the outer coding is denoted $C^0$.

More specifically, it is indicated that the outer code may advantageously consist of a trellis code or, equivalently, of a combination of trellis codes. The coded digital stream obtained following step A is denoted $C^0DS$ in FIG. 2. It consists of an outer coded sequence, denoted $\{\underline{c}_1, \ldots \underline{c}_{r0}\}$, this outer coded sequence consisting of coded bit symbols denoted $\underline{c}_n = \{c_{n,1}, \ldots, c_{n,n0}\}$ where $c_{n,1}$ to $c_{n,n0}$ denote the successive constituent bits of the coded symbol $\underline{c}_n$.

The coded digital stream $C^0DS$ is then subjected to a step B, after a subdivision into successive blocks for example, to a blockwise interleaving process so as to generate an interleaved coded digital stream, denoted $ILC^0DS$, thus exhibiting, owing, on the one hand, to the outer coding in step A and to the interleaving, on the other hand, temporal diversity.

In a general manner, it is indicated that the blockwise interleaving process in step B can be implemented by means of a random interleaver system denoted $\pi$.

Step B is itself followed by a step C consisting in subjecting the coded and interleaved digital stream $ILC^0DS$ to a demultiplexing, the coded and interleaved digital stream $ILC^0DS$ being subdivided by this operation into a given number $\nu$ of elementary interleaved coded digital streams, the set of these elementary interleaved coded digital streams being denoted in FIG. 2:

$$\{EILC^0DS_m\}_{m=1}^{m=\nu}$$

It is appreciated that each elementary interleaved digital stream in fact consists of a layer of rank m, which layer, in addition to the quality of temporal diversity introduced owing to the outer coding and to the interleaving, makes it possible, as will be described later in the description, to introduce a specific spatial coding.

The aforesaid step C is then followed by a step D consisting in subjecting each elementary interleaved coded digital stream, that is to say each signal at the level of each layer of rank $m \in [1, \nu]$ to a modulation process making it possible to convert each digital modulation string, consisting of $q_m$ successive bits of one and the same layer, into a $Q_m$-ary symbol, $Q_m = 2^{q_m}$ $m \in [1, \nu]$ according to a specific mapping scheme. In practice, the layers of interleaved coded digital stream consist of frames, at the rate of one frame per layer of rank m. Furthermore, each layer of rank m is itself subdivided into N bursts $\{\underline{u}_1^m, \ldots \underline{u}_\tau^m\}$ of $\tau$ bits consisting of symbols $\underline{u}_n^m = \{u_{n,1}^m \ldots u_{n,qm}^m\}$, these $\tau$ bits comprising the constituent tail bits of learning bits, formed for example by CAZAC sequences, known as such. Each burst is subject to a modulation by a $Q_m$-ary modulator, which modulator makes it possible to associate a complex symbol of the form $z_n^m = \phi(\underline{u}_n^m)$ with any input symbol $\underline{u}_n^m$.

It is indicated that the function $\phi$ designates any mapping law. By way of nonlimiting example, it is indicated that the mapping law according to a Gray code has turned out to give good results. Thus, at the end of step D, a $Q_m$-ary symbol denoted $EILCDS_m$ is available on each modulation pathway, where m designates the rank of the modulation pathway.

Step D is itself followed by a step E consisting in transmitting each aforementioned $Q_m$-ary symbol $EILCDS_m$ over a transmission channel by means of a distinct transmission antenna.

The set of distinct transmission antennas, denoted $\{ta_m\}_{m=1}^{m=\nu}$ forms a space-diversity array and consequently makes it possible to generate, from each $Q_m$-ary symbol $EILCDS_m$, a set of transmitted elementary digital streams exhibiting spatial and temporal diversity, by reason, on the one hand, of the outer coding introduced having regard to the blockwise interleaving, and to the apportioning of the transmission over the set of distinct transmission antennas, on the other hand.

As far as the latter is concerned, it is indicated that this set of transmission antennas forms a space-diversity array, each distinct constituent transmission antenna of this array being distanced from a neighboring distinct transmission antenna by a distance greater than $\lambda_0$, where $\lambda_0$ designates the wavelength of the carrier wave making it possible to ensure the transmission by modulation of each of the $Q_m$-ary symbols obtained on completion of step D.

The coding method thus makes it possible, on reception, to perform a decoding of the $Q_m$-ary symbols constituting the set of elementary digital streams transmitted $\{TEILCDS\}_{m=1}^{m=\nu}$ from a priori information items representative of the spatial and temporal diversity introduced into the coding.

More specifically, it is recalled that the aforesaid learning symbols, known as such, make it possible, after transmission, to perform a prior evaluation of the impulse response of the transmission channel, the transmission channel consisting of a plurality of propagation paths between the transmitter and the receiver, each path constituting an elementary transmission channel.

Under these conditions, owing to the multipath propagation and to the variable nature of the transmission channel by reason of the mobility between the transmitter and receiver, a time-varying frequency-selective radiofrequency channel can be modeled by the discrete-time impulse response of the equivalent channel, including of course the transmission and reception shaping filters used customarily, each corresponding elementary transmission channel being for this reason denoted:

$$\underline{h}^{m,r} = \{h_0^{m,r}, \ldots, h_{\chi_c-1}^{m,r}\}$$

for each path linking a transmission antenna of each layer m to a reception antenna of given rank r. In general, $r \in [1,\rho]$ with $\rho \neq \nu$. The number of reception antennas can be less than $\nu$.

In the above relation, $\chi^c$ designates the constraint length in terms of number of symbols transmitted, the constraint length being representative of the memory of the channel.

All the elementary channels are regarded as exhibiting the same constraint length $\chi_c$. Such an assumption is admissible since the number of components of individual multiple paths is essentially determined by broad structures and reflecting objects.

If, in accordance with the method within the meaning of the present invention, burst-by-burst transmission is taken into consideration, then, the elementary transmission channels and the resulting transmission channel are static throughout the duration of transmission of a burst and change independently from one burst to another. Under these conditions, the value $\tau$ can be regarded, to a first approximation, as a measure of the coherence time of the aforesaid channel. These conditions make it possible to establish an acceptable modeling for multipath quasi-static channels with slowly varying frequency fading and with frequency hopping.

The coefficients, denoted $\{h_k^{m,r}\}_k$, of each elementary channel can, in this case, be regarded as independent Gaussian complex random variables, with the same zero mean energy, satisfying relation (1):

$$\sum_{i=0}^{\chi_c-1} \|h_i^{m,r}\|^2 = 1 \tag{1}$$

At each discrete sampling time n, each reception antenna of rank r observes, under these conditions, a set of transmitted symbols corresponding to the transmitted elementary digital stream $\{TEILCDS_m\}_{m=1}^{m=\nu}$ and satisfying relation (2):

$$y_n^r = \sum_{m=1}^{\nu} \sum_{i=0}^{\chi_c-1} h_i^m z_{n-i}^{m,r} + \varsigma_n^r \tag{2}$$

In this relation $\varsigma_n^r$ represents a complex noise sample with zero mean value and with variance $2\sigma^2$. $\varsigma_n^r$ is a complex symmetric Gaussian variable, that is to say a variable whose real part and imaginary part are uncorrelated and of like energy $\sigma^2$.

A method of decoding a digital data stream coded with bitwise interleaving in multiple transmission and reception, the coding of this digital stream having been performed in accordance with the method as described in connection with the aforesaid FIG. 2, will now be described in conjunction with FIGS. 3a, 3b and 3c.

By reason of the coding of these digital data in accordance with the method described above, it is indicated that the decoding method, which is the subject of the present invention, consists, in a step F, in receiving the coded digital data stream consisting of the set of elementary digital streams transmitted over a transmission channel, this set of transmitted elementary digital streams being denoted $\{TEILCDS_m\}_{m=1}^{m=\nu}$, this reception being performed on a plurality $\rho$ of reception antennas. In FIG. 3a, the set of reception antennas is denoted $\{ra_r\}_{r=1}^{r=\rho}$.

Figure 3A:
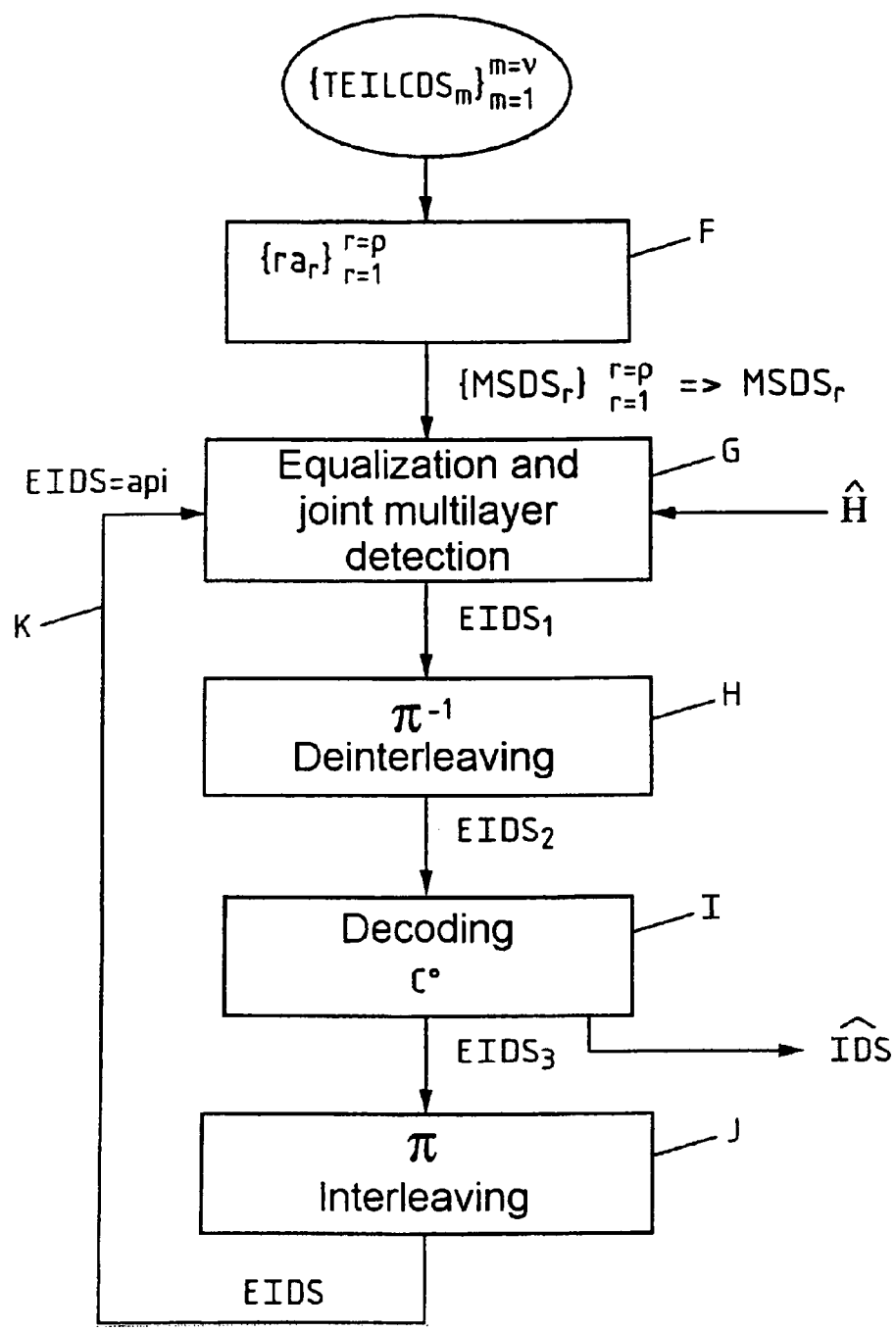
FIG. 3a represents, by way of illustration, a flowchart of the method of decoding, which is the subject of the present invention, a digital data stream coded in multiple transmission and reception, in accordance with the coding method illustrated in FIG. 2.

These reception antennas, the number of which is independent of the number of transmission antennas, may be fewer in number or equal to the number $\nu$ of transmission antennas and form, in accordance with an advantageous aspect of the decoding method, which is the subject of the present invention, an array of space-diversity reception antennas, so as to define a set of elementary streams of modulation symbols received, this set of elementary streams of modulation symbols received being denoted, on completion of step F of FIG. 3a, $\{MSDS_r\}_{r=1}^{r=\rho}$. It is understood in particular that each modulation symbol received is a symbol of the form $y_n^r$ satisfying relation (2) mentioned previously in the description.

Step F is then followed by a step G consisting in subjecting the set of elementary streams of modulation symbols received $\{MSDS_r\}_{r=1}^{r=\rho}$ to an iterative process of equalization of the transmission channel and of joint multilayer detection by means of an extrinsic information stream on the bits coded by the outer code and interleaved, this extrinsic information stream arising from a decoding on the basis of the outer code. In FIG. 3a, the extrinsic information stream on the bits coded by the outer code and interleaved is denoted EIDS=api. Specifically, this information stream constitutes an a priori information item on the coded bits and the equalization and joint multilayer detection process, implemented in step G by means of the extrinsic information stream on the coded bits EIDS =api, makes it possible to generate a first extrinsic information stream on the bits coded by the outer code and interleaved, this first extrinsic information stream being denoted $EIDS_1$ in FIG. 3a.

The aforesaid step G is followed by a step H consisting in subjecting the first extrinsic information stream $EIDS_1$ to a deinterleaving, denoted $\pi^{-1}$, so as to generate a second extrinsic information stream on the coded bits originating from the equalization and joint multilayer detection process, this second extrinsic information stream being denoted $EIDS_2$ in FIG. 3a. The deinterleaving operation is the operation inverse to the interleaving operation carried out during the implementation of the coding method, this deinterleaving process being denoted, for this reason, $\pi^{-1}$ in FIG. 3a.

The second extrinsic information stream on the coded bits $EIDS_2$ is then subjected, in step I, to a decoding on the basis of the outer code $C^o$ so as to generate a third extrinsic information stream on the coded bits, denoted $EIDS_3$, which arises from the decoding on the basis of the outer code $C^o$. It is noted that, during this operation I, the decoding furthermore provides an estimate of the value of the initial digital signal, denoted for this reason IDS.

Following step I, the third extrinsic information stream is subjected to an interleaving operation in step J so as to generate the extrinsic information stream on the bits coded by the first outer code and interleaved EIDS constituting the a priori information item on the coded bits, which is denoted api. This a priori information item is then reinjected in step K, symbolized by the return loop, into the iterative process of equalization of the transmission channel and joint multilayer detection, that is to say in step G of FIG. 3a.

With reference to FIG. 3a, it is understood in particular that the decoding method, which is the subject of the present invention, consists essentially in performing an equalization and a joint multilayer detection of the coded data, this equalization and this joint multilayer detection being associated iteratively with the outer decoding by means of the code $C^o$ so as to benefit from the a priori information item on the coded bits api which arises from the successive implementation of steps G, H, I and J. It is understood in particular that the extrinsic information stream on the bits coded by the first outer code and interleaved, the stream denoted EIDS in FIG. 3a, and constituting the a priori information item on the coded bits api, is an information item relating to each constituent bit of the symbols $z_n^m$ constituting the signal received on completion of step F. Thus, this a priori information item constitutes effective information as to the value of the constituent bits of the aforesaid symbols and, ultimately, of the spatial and temporal diversity introduced by the coding and transmission process described hereinabove.

A more detailed description of a particular mode of implementing the decoding method which is the subject of the present invention will now be given in conjunction with FIGS. 3b and 3c.

In the aforesaid specific embodiment, it is indicated that the latter corresponds to the implementation of a weighted input and output equalization and joint detection process of the so-called SISO type (soft input soft output).

Under these conditions, the a priori information item reinjected into the equalization and joint multilayer detection process of SISO type consists, advantageously, of a logarithmic value of the a priori probability ratio of the value of the coded bits, this logarithmic value constituting the extrinsic information item on the bits coded by the outer code and interleaved.

Figure 3B:
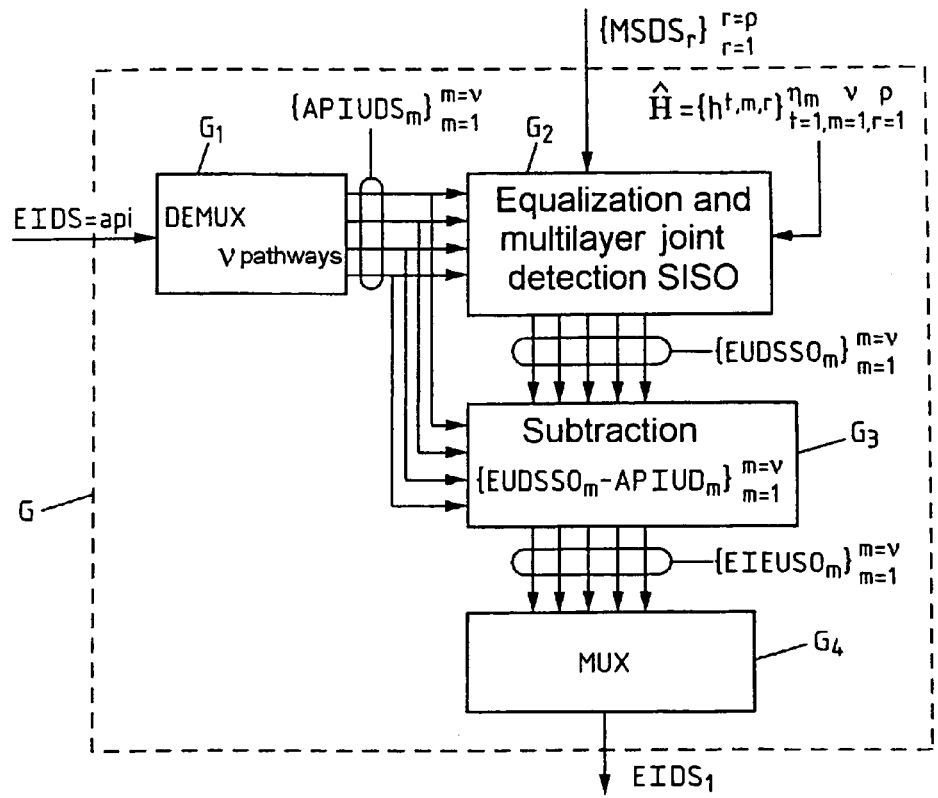
FIG. 3b represents, by way of illustration, a flowchart of a detail of implementation of an iterative process of equalization and joint multilayer detection within the framework of the decoding method according to the invention as represented in FIG. 3b.

As represented in FIG. 3b, the equalization and joint multilayer detection process G consists in demultiplexing, in a step $G_1$, the extrinsic information stream on the bits coded by the first outer code and interleaved EIDS constituting the a priori information item api as a set of streams of a priori information on the bits of the layers of coded and interleaved digital stream, this set of streams of a priori information on the bits of the layers of coded and interleaved digital stream being denoted $\{APIUDS_m\}_{m=1}^{m=v}$ in FIG. 3b.

Step $G_1$ is then followed by a step $G_2$ consisting in performing an equalization and a joint detection with soft input/output, that is to say of SISO type, applied to a trellis with a reduced number of states. This trellis is defined as the trellis of the constituent elementary-memory channels of the transmission channel, themselves having a reduced number of states, so as to generate a set of streams of weighted outputs on the bits of layers of interleaved coded digital stream. This stream of weighted outputs on the interleaved bits of layers of coded digital stream is denoted $\{EUDSSO_m\}_{m=1}^{m=v}$.

Step $G_2$ is followed by a step $G_3$ consisting in extracting from each stream of weighted outputs on the interleaved bits of the layers of coded digital stream $\{EUDSSO_m\}_{m=1}^{m=v}$ the a priori information item on the interleaved bits of the corresponding layers of coded digital stream $\{APIDUS_m\}_{m=1}^{m=v}$ so as to generate an extrinsic information stream denoted $\{EIEUSO_m\}_{m=1}^{m=v}$ on the interleaved bits of the layers of coded digital stream.

When the equalization and joint detection process implemented in step $G_2$ is an equalization and detection process of SISO type and when the inputs and outputs consisting of the a priori information item on the interleaved bits of the layers of coded digital stream $\{APIDUS_m\}_{m=1}^{m=v}$, respectively of the streams of weighted outputs on the interleaved bits of the layers of coded digital stream $\{EUDSSO_m\}_{m=1}^{m=v}$ are logarithmic probability values, the extraction process can be implemented, by reason of the logarithmic nature of this input/output information, by a subtraction, such as represented in step $G_3$ of FIG. 2b.

This subtraction is denoted:

$$\{EUDSSO_m - APIUD_m\}_{m=1}^{m=v}$$

It is thus noted that, on the one hand, the equalization and joint multilayer detection process is performed for each layer of rank m and that, on the other hand, the extraction process, and in particular the subtraction process in the case of the implementation of an equalization and joint decoding of SISO type, is also performed for each layer of rank m.

Following step $G_3$, the extrinsic information streams on the interleaved bits of the layers of coded digital stream $\{EIEUSO_m\}_{m=1}^{m=v}$ are subjected to a multiplexing operation $G_4$, so as to generate the first extrinsic information stream on the bits coded by the first outer code and interleaved, that is to say the stream $EIDS_1$.

Figure 3C:
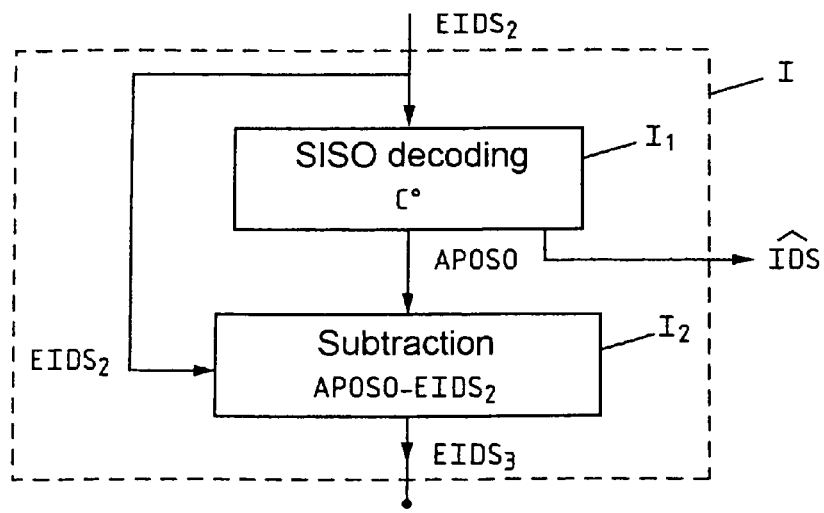
FIG. 3c represents, by way of illustration, a flowchart of a detail of implementation of a process for decoding with soft input/output, on the basis of an outer code, making it possible to obtain an extrinsic information stream on the coded bits, arising from the decoding on the basis of this outer code.

In the same way, as represented in FIG. 3c, and when the equalization and joint detection process implemented in step $G_2$ of FIG. 3b is of SISO type, the step of decoding by means of the outer code in step I of FIG. 3a can consist advantageously in subjecting, in a step $I_1$, the second extrinsic information stream on the coded bits originating from the equalization and joint detection process, extrinsic information stream denoted $EIDS_2$, to a weighted input/output decoding of SISO type by means of the outer code $C^o$, so as to generate a weighted-output stream, denoted APOSO, representative of an a posteriori information item on the coded bits. Step $I_1$ is followed by a step $I_2$ consisting in extracting the second extrinsic information stream $EIDS_2$ from the second weighted-output stream APOSO representative of the a posteriori information item on the coded bits, so as to generate the third extrinsic information stream on the coded bits $EIDS_3$. In the case of the implementation of step $I_1$ in the form of an SISO decoding on the basis of the outer code $C^o$, the extraction step in step $I_2$ is also a subtraction step by reason of the logarithmic nature of the constituent digital values of the streams $EIDS_2$ and APOSO.

A theoretical demonstration of the operating mode of the decoding method, which is the subject of the present invention, as described in conjunction with FIGS. 3a, 3b and 3c, will now be given hereinbelow.

In general, it is indicated that the equalization and joint decoding process implemented in step G, and more specifically in step $G_2$ of FIG. 2b, is implemented on the set of layers of rank m on each of the ν concomitant bursts, successively, so as to calculate the first extrinsic information stream on the bits coded by the outer code and interleaved, that is to say the stream $EIDS_1$, from the extrinsic information stream on the bits coded by the outer code and interleaved and arising from a decoding on the basis of the outer code $C^o$, the aforesaid extrinsic information stream EIDS, constituting the a priori information item on the coded bits api.

It is indicated in a conventional manner that this calculation is performed on the basis of an estimate of the coefficients of the transmission channel, this estimate being obtained on the basis of the learning symbols received in the elementary streams of modulation symbols received $TEILCDS_m$.

In the case, as represented in FIG. 2b, where the equalization and joint decoding process carried out in step $G_2$ is of SISO type, the inputs and outputs of this decoding corresponding to sequences of logarithmic value of the ratio of the extrinsic probabilities on each of the bits of each modulation symbol observed from the set of N symbol sequences observed by the set of reception antennas, these observed sequences being denoted $\{y_1^r, \ldots, y_\tau^r\}_{r=1}^{r=P}$ and of length τ in terms of number of observed symbols received, the estimate of the transmission channel is expressed in the form of a set of estimates of the coefficients of each elementary channel of a transmission antenna with all the reception antennas in the form $\hat{H}=\{h^{m,r}\}_{M=1,r=1}^{\nu\ P}$.

At the first iteration of the iterative process of equalization and joint detection, the calculation is performed in the absence of any prior information item, the estimated values of the coefficients of the elementary channels being calculated simply from the learning sequences and the corresponding sequences obtained on the modulation symbols observed. The sequences of streams of weighted outputs on the interleaved bits of the layers of coded digital stream $EUDSSO_m$ obtained on completion of step $G_2$ are classed by frames, subjected to step $G_3$ of extraction and in particular of subtraction on the basis of the a priori information item api obtained for each of the layers from the demultiplexing operation $G_1$. The extrinsic information streams on the bits of the user frames obtained on completion of step $G_3$ and denoted $\{EIEUSO_m\}_{m=1}^{m=\nu}$ are then subjected to the multiplexing operation of step $G_4$, so as to generate the first extrinsic information stream on the bits coded by the first outer code and interleaved $EIDS_1$ mentioned previously.

The deinterleaving operation carried out in step H of FIG. 3a on the first extrinsic information stream on the bits coded by the first outer code and interleaved then makes it possible to generate the second extrinsic information stream on the coded bits originating from the equalization and joint decoding process $EIDS_2$, which constitutes a new sequence of logarithmic values of intrinsic probability ratio on the coded bits, for the step of outer decoding I on the basis of the outer code $C^o$.

The aforesaid step I of decoding on the basis of the outer code $C^o$ is then performed, as represented in FIG. 3c, by the succession of steps $I_1$ and $I_2$ by means of an SISO type decoding and in particular of a BCJR algorithm in the logarithmic domain, the decoding step $I_1$ making it possible under these conditions to evaluate the sequence of the logarithmic values of the extrinsic probability ratios on each of the bits of each of the symbols coded by way of the outer code $C^o$. This sequence is obtained following the extraction by subtraction in step $I_2$ of the second extrinsic information stream on the coded bits $EIDS_2$, from the weighted-output stream representative of the a posteriori information item on the aforesaid coded bits APOSO. The third extrinsic information stream on the coded bits $EIDS_3$, which is representative of the logarithmic value of the extrinsic probability ratios on each of the symbols coded by the first outer code $C^o$ is then subjected in step J to an interleaving so as to generate the a priori information item EIDS=api. This a priori information item api is then reinjected at the level of the SISO equalization and decoding process $G_2$ of FIG. 3b, by way of a demultiplexing $G_1$ over the set of ν pathways or layers. The set of the corresponding information items for each layer and following burstwise segmentation, so as to constitute the set of a priori information streams on the bits of layers divided into bursts or packets, is thus reintroduced at the level of the equalization and joint detection process $G_2$. The aforesaid equalization and joint detection process $G_2$ then performs the equalization and detection on n frames of ν sequences of logarithmic value of the ratio of a priori probability on the bits of the modulation symbols observed $\{MSDS_r\}_{r=1}^{r=P}$.

The method as described in FIG. 3a and in particular in FIGS. 3b and 3c, makes it possible to nest an additional process for reestimating each distinct elementary channel generating intersymbol interference into the conventional iterative turbo-detection process.

A more detailed description of a system for coding a digital data stream coded by spatio-temporal combinations, in multiple transmission and reception, will now be given in conjunction with FIG. 4a.

As represented in FIG. 4a, it is indicated that the coding system advantageously includes a module 10 for outer coding of an initial digital data stream IDS on the basis of a code of specified rate $C^o$, so as to generate the aforementioned coded digital stream $C^oDS$. The outer coding module 10 is followed by a blockwise interleaving module 11 making it possible, on the basis of the coded digital stream $C^oDS$, to generate an interleaved coded digital stream exhibiting, owing, on the one hand, to the outer coding previously introduced and to the interleaving carried out, on the other hand, specific temporal diversity. The interleaved coded digital stream is denoted $ILC^oDS$.

This interleaving module 11 is itself followed by a demultiplexer module 12 receiving the interleaved digital stream $ILC^oDS$, the demultiplexer module 12 making it possible to generate a number ν of elementary interleaved coded digital streams, these elementary interleaved coded digital streams being subdivided into frames, themselves subdivided into bursts, as described previously in the description.

In FIG. 4a, each elementary interleaved coded digital stream or each frame constituting a layer of rank m is denoted $EILC^ODS_m$.

The coding system furthermore includes, as represented in FIG. 3a, a plurality of $Q_m$-ary modulator circuits, denoted $13_1$ to $13_v$, each modulator circuit making it possible to associate a complex symbol $z_n^m$ with any input symbol $\underline{u}_n^m$ according to a specific mapping law. Furthermore, a plurality of transmission antennas $\{ta_m\}_{m=1}^{m=v}$ is provided and makes it possible to achieve the transmission of each coded elementary digital stream consisting of symbols, a distinct transmission antenna of rank m achieving the transmission of the elementary digital stream $EILC^ODS_m$.

According to a noteworthy aspect of the coding system, the set of transmission antennas forms a space-diversity array, each transmission antenna $ta_m$ being distanced from a neighboring transmission antenna $ta_{m'}$, with m≠m', by a distance d>$\lambda_0$, as mentioned previously in the description, $\lambda_0$ designating the wavelength of the carrier wave ensuring the transmission of the aforesaid elementary digital streams.

Having regard to the makeup of the set of transmission antennas as an array of space-diversity antennas, the system thus makes it possible to generate a set of transmitted elementary digital streams, denoted $\{TEILCDS_m\}_{m=1}^{m=v}$, which set exhibits spatial and temporal diversity, by reason, on the one hand, of the outer coding introduced by the coding module 10 and the interleaving module 11 and, on the other hand, of the processing by layers of rank m of each frame and of the transmission by each of the constituent antennas of the aforesaid array of antennas.

A description of a system for decoding a digital data stream coded with bitwise interleaving, in accordance with the coding method hereinabove, in multiple transmission and reception, this coded digital data stream consisting of at least a set of transmitted elementary digital streams, denoted $\{TEILCDS_m\}_{m=1}^{m=v}$, as described previously in the description, will now be given in conjunction with FIG. 4b.

Figure 4B:
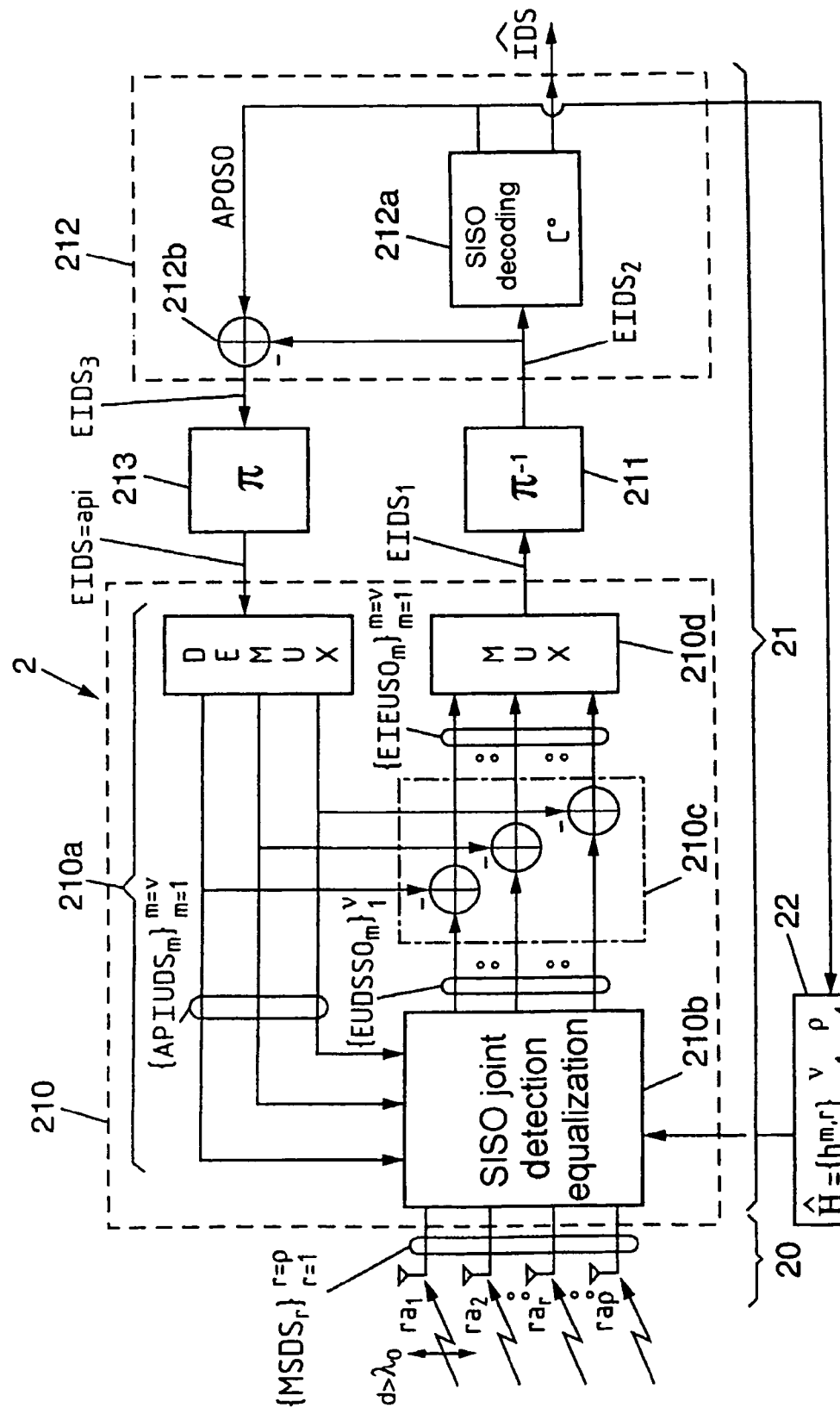

With reference to the aforesaid FIG. 4b, the decoding system which is the subject of the present invention comprises a plurality of reception antennas, denoted $\{ra_r\}_{r=1}^{r=\rho}$, these reception antennas making it possible to receive the set of elementary digital streams transmitted by the transmission channel constituted by the set of elementary transmission channels, as described previously in the description.

According to a noteworthy aspect of the decoding system, which is the subject of the present invention, the aforesaid reception antennas can be fewer in number or equal to the number v of transmission antennas and form an array of space-diversity reception antennas 20, so as to define a set, denoted $\{MSDS_r\}_{r=1}^{r=\rho}$, of elementary streams of modulation symbols received. The array 20 of space-diversity reception antennas is followed by a module 21 for turbo-detection of the elementary streams of aforesaid modulation symbols received by equalization and iterative joint detection, as described previously in the description in relation to the decoding method which is the subject of the present invention.

Thus, as represented more specifically in FIG. 4b, the turbo-detection module 21 includes a module 210 for equalization of the transmission channel and for joint detection by layers on the basis of an extrinsic information stream on the bits coded by the first outer code and interleaved EIDS=api, this extrinsic information stream arising from a decoding on the basis of the outer code $C^0$ and constituting an a priori information item on the previously mentioned coded bits. In FIG. 4b, the extrinsic information stream on the bits coded by the first outer code and interleaved is denoted EIDS=api by reason of the fact that this stream in fact constitutes an a priori information item api on the coded bits.

The module 210 for equalization of the transmission channel and for joint detection makes it possible, on the basis of the elementary streams of modulation symbols received $MSDS_r$, to generate a first extrinsic information stream $EIDS_1$ on the bits coded by the outer code and interleaved. The module 210 for equalization of the transmission channel and for joint decoding is followed by a module 211 for deinterleaving, denoted by $\pi^{-1}$, of the first extrinsic information stream $EIDS_1$ so as to generate a second extrinsic information stream on the coded bits $EIDS_2$ originating from the equalization and joint detection module 210.

Furthermore, a module 212 for decoding on the basis of the outer code $C^0$ is provided, which receives the second extrinsic information stream $EIDS_2$ delivered by the interleaving module 211, so as to generate a third extrinsic information stream $EIDS_3$ on the coded bits, this third extrinsic information stream arising from the decoding on the basis of the outer code $C^0$.

Of course, the module 212 for decoding on the basis of the outer code makes it possible to obtain an estimate, denoted $\hat{IDS}$, of the initial digital stream IDS transmitted, in accordance with the coding method and by virtue of the coding system, previously described in the description.

A module 213 for interleaving the third extrinsic information stream $EIDS_3$ is also provided, so as to generate the extrinsic information stream on the bits coded by the first outer code and interleaved, and denoted EIDS=api, constituting the a priori information item on the coded bits, which information item is reinjected into the module 210 for equalization of the transmission channel and for joint decoding.

The decoding system, which is the subject of the present invention, as represented in FIG. 4b, will now be described in more detail with reference to the same figure in the case where the a priori information item on the coded bits consists of a logarithmic value of the extrinsic probability ratio of the aforesaid coded bits, this a priori information item possibly being obtained in particular when the equalization and joint detection process is an SISO type process, that is to say one with soft input and soft output.

With reference to FIG. 4b, it is indicated that the equalization and joint detection module 210 comprises, in the aforesaid embodiment, a module $210_a$ for injecting the a priori information item api, comprising a demultiplexer module, denoted DEMUX, this demultiplexer module delivering, from the aforesaid a priori information item, consisting of the extrinsic information stream on the bits coded by the outer code and interleaved EIDS=api, a set of streams of a priori information item on the interleaved bits of the layers of coded digital stream, which stream is denoted $\{APIDUS_m\}_{m=1}^{m=v}$.

It is of course understood that in order to ensure equalization and joint decoding on the basis of layers, that is to say on the basis of frames and on the basis of bursts actually transmitted, as described previously in the description related to the coding method, the object of the demultiplexer module DEMUX is to demultiplex the extrinsic information stream EIDS on the bits coded by the outer code and interleaved, constituting the a priori information item on the coded bits, over one and the same number v of demultiplexing pathways as the number of layers of coded and interleaved digital stream which are generated on transmission.

Under these conditions, the equalization and joint detection module 210 furthermore comprises a detection module $210_b$ with weighted input and output, SISO module, which receives as input, on the one hand, the stream of a priori information on the bits of user frames $\{APIDUS_m\}_{m=1}^{m=\nu}$ and, on the other hand, the elementary streams of modulation symbols received $\{MSDS_r\}r=1^{r=\rho}$. Of course, the weighted inputs/outputs decoding module $210_b$ also receives the estimate of the coefficients of the transmission channel $\hat{H}=\{h^{m,r}\}_{m=1,r=1}^{\nu,\rho}$ of the coefficients of the elementary transmission channels, delivered on the basis of a calculation chain 22 receiving the second weighted-output stream APOSO representative of the a posteriori information item on the coded bits. The calculation chain 22 can comprise in cascade an interleaving module $\pi$ and a nonlinear decision module, which are followed by a module for calculating the coefficients of the channel.

The decoding module $210_b$ delivers a stream, denoted $\{EUDSSO_m\}_{m=1}^{m=\nu}$ of weighted outputs on the interleaved bits of layers of coded digital stream.

The module $210_b$ is followed by a plurality, denoted $210_c$, of subtractor modules, each subtractor module making it possible to subtract from each stream of weighted outputs on the interleaved bits of the layers of coded digital stream $\{EUDSSO_m\}$ the a priori information item on the interleaved bits of the layers of coded digital stream $\{APIUDS_m\}$ so as to deliver a stream, denoted $\{EIEUSO_m\}_{m=1}^{m=\nu}$ of extrinsic information on the interleaved bits of the streams of the layers of coded digital stream.

A multiplexer module $210_d$ is then provided, this multiplexer module receiving the extrinsic information streams $EIEUSO_m$ on the interleaved bits of the layers of coded digital stream and delivering the first extrinsic information stream on the bits $EIDS_1$ coded by the outer code and interleaved to the deinterleaving module 211.

Furthermore, with reference to the same FIG. 4a, it is indicated that the module 212 for decoding on the basis of the outer code $C^o$ can comprise a detection module $212_a$ with weighted inputs/outputs, receiving the aforesaid second extrinsic information stream on the coded bits $EIDS_2$ originating from the equalization and joint detection process implemented by the module 210, the decoding module with weighted inputs/outputs $210_a$ delivering a stream of weighted outputs which is representative of an a priori information item on the coded bits APOSO. The module $212_a$ is associated with a subtractor module $212_b$ making it possible to subtract the weighted-outputs stream representative of an a priori information item on the coded bits APOSO, the second extrinsic information stream $EIDS_2$ so as to deliver the third extrinsic information stream on the coded bits $EIDS_3$ which arises from the decoding on the basis of the outer code $C^o$.

A demonstration of the operating mode of the SISO type equalization and joint detection module $210_b$ will now be given hereinbelow.

Under these conditions, the aforesaid equalization/joint detection process can be regarded as a discrete Markov model with a finite number of states.

Under these conditions, the channel equivalent to intersymbol interference can be understood as a nonsystematic nonrecursive convolutional code with memory, expressed in terms of symbol times, $\chi_c-1$, whose unique complex generating polynomial is liable to vary over time. The latter, for the sake of simplicity of nomenclature, is referred to as the intersymbol interference code.

Each layer m consisting of an antenna is thus associated with a specific intersymbol interference code.

The intersymbol interference code associated with the layer of rank m is thus a Markov model with a finite number of states which is invariable over time and which admits a trellis representation $T^m(V^m, B^m)$ where $V^m$ and $B^m$ denote the space of states or vertices and the space of branches respectively.

The trellis $T^m$ is defined at each sampling instant n by the states or vertices according to relation (3) or (4):

$$s_n^m = \{z_{n-\chi_c+1}^m, \ldots, z_{n-1}^m\} \quad (3)$$

$z_{n-t}^m$ denoting the successive complex symbols, or equivalently:

$$s_n^m = \{\underline{u}_{n-\chi_c+1}^m, \ldots, \underline{u}_{n-1}^m\} \quad (4)$$

where $\underline{u}_{n-t}^m$ denotes the symbols constituted by the arrangements of successive bits and by the branches $b_m$. The branches $b_m$ contain three fields, $b_m = \{b_m^-, b_m^+, b_m^\nabla\}$ consisting of:

a departure state $b_m^- \in V_{n-1}$;
an arrival $b_m^- \in V_n$;
a label $b_m^\nabla$ representing an input symbol $\underline{u}_n^m$ where $b_m^\nabla = \{b_{m,1}^\nabla, \ldots, b_{m,q+n}^\nabla\}$ is the binary representation of $\underline{u}_n^m$. The complexity of the state space and of the branch space satisfies relation (5):

$$|V^m| = Q_m^{\chi_c-1}, \forall n \in [0,\tau] \text{ and } |B^m| = Q_m^{\chi_c}, \forall n \in [1,\tau] \quad (5).$$

The above considerations can be generalized to the entire multilayer structure. The states and the input sequences of the resulting Markov model correspond simply to the concatenation of states or of input sequences of the elementary Markov models modeling the intersymbol interference code associated with each layer.

The associated combined trellis $T^\otimes$ is the Cartesian product $\otimes$ of the $\nu$ trellises $\{T^m\}_{m=1}^\nu$. Thus, the corresponding complexity values are given by relations (6) and (7):

$$|V_n^\otimes| = \prod_{m=1}^\nu |V_n^m| \quad (6)$$

$$|B_n^\otimes| = |V_n^\otimes| \cdot \prod_{m=1}^\nu Q_m \quad (7)$$

where $V_n^\otimes$, $B_n^\otimes$, $V_n^m$ and $B_n^m$ designate the vertices and the branches of the trellises $T^\otimes$ and $T^m$ at any section $n \in [1, \tau]$.

With the aim of implementing the equalization and joint detection process, it is necessary to calculate the logarithmic value of the a posteriori probability ratios of value on each bit of each of the symbols $\underline{u}_n^m$ at each sampling instant $n \in [1, \tau]$ and for each layer of rank $m \in [1,\nu]$.

Such a calculational process can be implemented in an optimal manner by applying the BCJR algorithm to the resulting multilayer trellis $T^\otimes$ ($V^\otimes$, $B^\otimes$). The calculational and memory storage constraints of an optimal algorithm such as this being substantially linear as a function of $|B^\otimes|$, such an approach turns out to be rapidly prohibitive in terms of complexity and cannot therefore be adopted.

One possibility for overcoming a complexity hurdle such as this consists in reducing all the trellises $T^m$ of layer of rank m to subtrellises $T^m$ ($V^m, B^m$) by reducing the length constraint $\chi_c$ to a lower arbitrary value $k_m$, $k_m \in [1, \chi c]$. The arbitrary value $k_m$ can be tailored to each layer.

The substates of each subtrellis $T^m$ are thus defined by relation (8):

$$s_n^m = \{\underline{u}_{n-k_m+1}^m, \ldots, \underline{u}_{n-1}^m\} \tag{8}$$

and the complexity of the state space and branch space of the subtrellis $T^m$ satisfies relation (9):

$$|V^m| = Q_m^{k_m - 1}, \forall n \in [0, \tau] \tag{9}$$

$$|B^m| = Q_m^{k_m}, \forall n \in [1, \tau]$$

Under these conditions, the equalization and joint multi-layer detection process with weighted inputs and outputs can be implemented according to a generalized survivor-based processing concept, which concept will be set forth herein-below.

By reason of the fact that only a part of the memory of the intersymbol interference code associated with each layer of rank $m \in [1, \nu]$ is held in the resulting trellis of substates, the transmitted modulation symbols $z_n^m$ involved in the Euclidian branch metrics and which are not directly accessible must be recalculated explicitly by virtue of a per survivor processing, PSP processing.

With the aim of limiting the well-known error propagation effect, the PSP processing requires that the elementary channels from each transmission antenna to all the reception antennas be minimum-phase channels. Unfortunately, it is not in general possible to implement a finite length filter with multiple inputs and outputs making it possible to exactly meet the aforesaid minimum phase constraint. A generalized Viterbi algorithm, GVA algorithm, has been proposed, in which the basic concept consists in compensating for the degradation in PSP processing performance by retaining a number $\Omega$ of survivor paths greater than one per substate. The corresponding processing is referred to as generalized per survivor processing or GPSP processing.

The application of the GVA algorithm to channel equalization and to joint detection has turned out to be especially robust to the phenomenon of error propagation. See the article published by R. VISOZ, A. O. BERTHET, P. TORTE-LIER "*Joint Equalization and Decoding of Trellis-Encoded Signals using the Generalized Viterbi Algorithm*", published by IEEE VTC 2000, Boston, USA.

In particular, the GPSP processing approach renders the implementation of minimum-phase prefiltering unnecessary.

Various modes of implementation of SISO type equalization and joint detection processes making it possible to benefit from the advantages of the principle of GPSP processing will now be described hereinbelow.

A very significant reduction both in terms of calculational complexity and of memory storage constraints can be obtained by eliminating the backward recursion process and by carrying out the processing of the soft outputs during the forward recursion process, as has been proposed in the SOVE weighted output Viterbi equalizer, and in the SOVA weighted output Viterbi algorithm which were described by G. BAUCH, V. FRANZ in the article entitled "*A Comparison of Soft-in and Soft-out Algorithms for Turbo-Detection*", Proceedings of ICT vol. 2, pp. 259–263, Portos Carras, Greece, June 1998, respectively by J. HAGENAUER, P. HOEHER in the article entitled "*A Viterbi Algorithm with Soft-Decision Outputs and its Applications*", published by Proc., IEEE Globecom'89, pp. 1680–1686, Dallas, USA, November 1989.

The aforesaid implementations are designated SOVE type and SOVA type algorithm respectively with reference to the corresponding SOVE and SOVA algorithms respectively.

As far as the SOVE type algorithm is concerned, it is assumed that at any section $n \in [1, \tau]$, with each departure substate $s' \in V_{n-1}^{\circledS}$ are associated:

an ordered list $\{\underline{u}_{n-1,\omega}^{\rightarrow}(s'), \omega \in [1,\Omega]\}$ of the $\Omega$ best accumulated metrics of substates during forward recursion;

an ordered list $\{\hat{\underline{u}}_{i=n-\theta-1_\omega}^{n-1\ s'}, \omega \in [1,\Omega]\}$ of the $\omega$ corresponding survivor paths $$\hat{\underline{u}}_{i=n-\theta-1\omega}^{n-1\ s'} = \{\hat{\underline{u}}_{n-\theta-1\ \omega}^{s'}, \ldots, \hat{\underline{u}}_{n-1\omega}^{s'}\}$$

terminating at s'.

The SOVA type algorithm also requires:

an ordered list $\{\hat{L}_{i=n-\theta-1_\omega}^{n-1\ s'}, \omega \in [1,\Omega]\}$ of the $\omega$ unsigned weighted bit sequences $$\hat{L}_{i=n-\theta-1\ \omega}^{n-1\ s'} = \{\hat{L}_{n-\theta-1\omega}^{s'} \hat{L}_{n-\theta\omega}^{s'}, \ldots, \hat{L}_{n-1\omega}^{s'}\}$$

associated with the survivor paths.

The generalized SOVE and SOVA type algorithms with a single direction of recursion execute a forward recursion, to depth n, for each termination substate $s \in V_n^{\circledS}$, calculate for all the transitions $b \in B_n^{\circledS}$ such as $b^+ = s$ and for all ranks $\omega \in [1,\Omega]$, the $\Omega \times \Pi_{m-1}^{\nu} Q_m$ new accumulated metrics of substates according to relation (10):

$$i\ \mu_{n,}^*(s) = \mu_{n-1,j}(b^-) + \xi_{n,i}(b) \tag{10}$$

with $$\xi_{n,\omega}(b) = \frac{1}{2\sigma^2} \sum_{r=1}^{\rho} \left\| y_n^r - \sum_{m=1}^{\nu} \sum_{i=0}^{\chi_c-1} \hat{h}_i^{m,r} z_{n-i\omega}^m b^- \right\|^2 - \sum_{(m,j)} \ln Pr(b_{m,j}^\nabla)$$

In designating the neperian logarithm.

These metrics are then ranked in order of ascending value. This recursion is executed with the boundary conditions given by relation (11):

$$\mu_{\overline{0},1}(0) = 0; \mu_{\overline{0},\omega}(0) = \infty \text{ for } \omega > 1 \tag{11}$$

and $\mu_{\overline{0},\omega}(s) = \infty, \forall s \neq 0, \omega \in [1,\Omega]$.

Only the best $\Omega$ metrics, the smallest, are stored at the level of substate s for the step of the next section.

Simultaneously, the past survivor paths $\hat{\underline{u}}_{i-\theta-1\ \omega}^{n-1\ s'}$, $\omega \in [1,\Omega]$ are extended according to the existing transitions s': $\underline{u}_n \rightarrow s$. The $\Omega \times \times \Pi_{m=1}^{\nu} Q_m$ new potential survivor paths $\hat{\underline{u}}_{in-\theta\ \omega}^{n\ s'}$ are stored temporarily and sorted according to the rank of their associated metric $\mu_{\overline{n},\omega}(s)$ but only the $\Omega$ survivor paths whose metrics are the best are actually used for the step of the next section.

The generalized SOVE type algorithm calculates the logarithmic value of the extrinsic probablity ratio of the bit value $u_{n-\theta,j}^m$ according to relation (12):

$$\lambda^e(u_{n-\theta,j}^m) = \min_{1 \leq \omega \leq \Omega} \left\{ \min_{b \in B_n^\otimes, \hat{u}_{n-\theta,j\omega}^m b^- = 0} \{u_{n-1,\omega}^{\rightarrow}(b^-) + \xi_{n,\omega}^{e,j}(b)\} \right\} - \tag{12}$$

$$\min_{1 \leq \omega \leq \Omega} \left\{ \min_{b \in B_n^\otimes, \hat{u}_{n-\theta,j\omega}^m b^- = 1} \{u_{n-1,\omega}^{\rightarrow}(b^-) + \xi_{n,\omega}^{e,j}(b)\} \right\}$$

which relation, in practice, reduces to relation (13):

$$\lambda^e(u_{n-\theta,j}{}^m) = \lambda(u_{n-\theta,j}{}^m) - \lambda^p(u_{n-\theta,j}{}^m) \quad (13)$$

where $\lambda(u_{n-\theta,j}{}^m)$ is an approximate value of the logarithm of the ratio of the a posteriori probabilities of the values of the bit $u_{n-\theta,j}{}^m$, defined by relation (14):

$$\lambda(u_{n-\theta,j}^m) = \min_{1 \leq \omega \leq \Omega} \left\{ \min_{b \in B_n^\otimes, \bar{a}_{n-\theta,j\omega}^{m\ b^-} = 0} \{u_{n-1,\omega}^{\rightarrow}(b^-) + \xi_{n,\omega}(b)\} \right\} - \\ \min_{1 \leq \omega \leq \Omega} \left\{ \min_{b \in B_n^\otimes, \bar{a}_{n-\theta,j\omega}^{m\ b^-} = 1} \{u_{n-1,\omega}^{\rightarrow}(b^-) + \xi_{n,\omega}(b)\} \right\} \quad (14)$$

and where $\lambda^p(u_{n-\theta,j}{}^m)$ is a value of the logarithm of the ratio of the probabilities of the value of the bit $u_{n-\theta,j}{}^m$ equal to 1, respectively to zero emanating from the decoding by means of the outer code $C^o$ satisfying relation (15):

$$\lambda^p(u_{n-\theta,j}^m) = \ln \frac{Pr(u_{n-\theta,j}^m = 1)}{Pr(u_{n-\theta,j}^m = 0)} \quad (15)$$

The generalized SOVA type algorithm operates in a slightly different manner.

In a similar manner to the survivor paths, the unsigned weighted sequences of bit information $\hat{L}_{i=n-\theta-1\ \omega}^{n-1\ s'}$, $\omega[1,\Omega]$ are firstly extended according to existing transitions $_{s'_{:-n}}{}^u \rightarrow s$.

The $\Omega \times \Pi_{m=1}^v Q_m$ new potential unsigned weighted sequences $\hat{L}_{i=n-\theta^*}^{n\ s}$ are stored temporarily and sorted as a function of the rank of the corresponding metrics $\mu_{n,*}^{\rightarrow}(s)$. For each layer $m \in [1,v]$ and for each input bit of a symbol $j \in [1,q_m]$ the unsigned weighted sequences $\hat{L}_{n,j\ \omega}^{m\ s}$ are initialized according to the relation (16):

$$\hat{L}_{n,j\ \omega}^{m\ s} = \infty \quad (16)$$

Once again, the best $\Omega$ unsigned weighted sequences are alone stored for the step of next section. The weighted decision step for updating the algorithm is then executed.

For any substate $sOV_n^{\circledcirc}$ for each layer m 0 [1,v], for each input bit j 0 [1, $q_m$] and for each rank $\omega$0 [1,$\Omega$], the unsigned weighted sequences of information on the value of bits $\hat{L}_{i=n-\theta\ \omega}^{n\ s}$ are updated by downward recursion from the depth i=n-1 to the depth i=n-$\delta$ according to relation (17):

$$\hat{L}_{i,j\ \omega}^{m\ s} = f(\hat{L}_{i,j\ \omega}^{m\ s}, \Delta_{n,j\ \omega}^{m\ s}) \quad (17)$$

in which relation f(.) is an updating function and where:

$$\Delta_{n,j\ \omega}^{m\ s} = \mu_{n\bar{\omega}_{ij}^m}^{\rightarrow}(s) - \mu_{n,\omega}^{\rightarrow}(s) \quad (18)$$

with $$\bar{\omega}_{i,j}^m = \min\{l \geq \Omega + 1, \hat{a}_{i,j\ l}^{m\ s} \neq \hat{u}_{i,j\ \omega}^{m\ s}\} \quad (19)$$

According to a specific mode of implementation, the updating function f(.) can advantageously satisfy relation (20):

$$f(\hat{L}_{i,j\ \omega}^{m\ s}, \Delta_{n,j\ \omega}^{m\ s}) = \ln \frac{1 + \exp(\hat{L}_{i,j\ \omega}^{m\ s} + \Delta_{n,j\ \omega}^{m\ s})}{\exp(\hat{L}_{i,j\ \omega}^{m\ s}) + \exp(\Delta_{n,i\ \omega}^{m\ s})} \quad (20)$$

and can be established according to an approximate expression satisfying relation (21):

$$f(\hat{L}_{i,j\ \omega}^{m\ s}, \Delta_{n,j\ \omega}^{m\ s}) \sim \min\{\hat{L}_{i,j\ \omega}^{m\ s}, \Delta_{n,j\ \omega}^{m\ s}\} \quad (21)$$

for $n \geq \theta$, the algorithm delivers signed weighted values of information on the bits of the symbol $\underline{u}_{n-\theta}$. These signed weighted values:

$$\lambda(u_{n-\theta,j}^m) = (2 \times \hat{u}_{n-\theta,j\ 1}^{m\ sbest} - 1) \times \hat{L}_{n-\theta,j\ 1}^{m\ sbest} \quad (22)$$

are calculated for m 0 [1,v] j 0 [1, $q_m$] by using the survivor path of first rank $\hat{u}_{i=n-\theta\ 1}^{n\ sbest}$ and the sequence of signed weighted values of information on the bits $\hat{L}_{i=n-\theta\ 1}^{n\ sbest}$ which each terminate, at section n, in the substate sbest.

The substate sbest is defined according to relation (23):

$$sbest = \arg\min\{u_{n,1}^{\rightarrow}(s), s \in V_n^{\circledcirc}\} \quad (23).$$

Eventually, a directly usable approximate value of the logarithm value of the ratio of the probabilities of the value of the bits $u_{n-\theta,j}{}^m$ is calculated by subtraction for each bit of the value of the logarithm of the ratio of the a priori probabilities of the value of the bit $\lambda^a(u_{n-\theta,j}{}^m) = $APOSO, delivered by the outer decoder 212a, from the signed weighted values obtained $\lambda(u_{n-\theta,j}{}^m) = $EIDS$_2$ according to relation (24):

$$\lambda^e(u_{n-\theta,j}^m) = \lambda(u_{n-\theta,j}^m) - \lambda^a(u_{n-\theta,j}^m) \quad (24).$$

FIGS. 5a to 5d represent simulation charts of the value of the bit error rate on decoding, BER, as a function of the signal-to-noise ratio Eb/No expressed in dB and of the successive iterations in various situations. The test channel consisted of a standardized channel of EQ$_3$ type, that is to say a channel consisting of three separate echoes of the symbol time, each echo following a Rayleigh distribution. Furthermore, the outer code C$^o$ was a convolutional code of rate ½ with 16 states and the interleaving process was of size 128×8 bits.

FIG. 5a represents such a simulation in the case of the implementation of a process of the prior art according to FIG. 1a. The trellis of the equalization process in this case corresponded to a 64-state trellis.

It is observed that the bit error rate BER attained the value 1.00×10$^{-4}$ for a signal-to-noise ratio of value 9 dB at the third iteration #3.

FIG. 5b corresponds to a coding/decoding process in accordance with the subject of the present invention, in which the number of layers v=3. In this situation, the trellis corresponding to the equalization and joint detection process also had 64 states and a single survivor path, i.e. $\Omega$=1.

One notes, in particular, a value of the bit error rate of the same order of magnitude BER=1.00×10$^{-4}$ while the signal-to-noise ratio is only 7 dB onward of the second iteration #2.

FIG. 5c corresponds to a coding/decoding process in accordance with the subject of the present invention, executed under the conditions similar to those of FIG. 5b, the number of layers v having been raised to v=4, however. Furthermore, the trellis of the equalization and joint detection process had a number of states equal to 16 and the number of survivor paths adopted was $\Omega$=8.

While the performance, in this situation, remains broadly superior to that of the prior art, represented in FIG. 5a, both as regards reduction in the bit error rate and speed of convergence, the mere increasing of the number of layers does not appear to be able to improve this set of criteria with regard to the process which is the subject of the invention, described in FIG. 5b.

Finally, FIG. 5d corresponds to a coding/decoding process in accordance with the subject of the invention, the number of layers being taken equal to $v=3$, for various values of the number $\Omega$ of survivor paths adopted, as compared with an optimal decoding process of BCJR type. While the BCJR equalization and joint detection process comprised 64 states, the number of states of the SOVA type process, designated SOVA like, was restricted to 8 states, the number $\Omega$ of survivor paths, taken as trial parameter, having been raised successively from $\Omega=1$ to $\Omega=4$.

It is noted that, for a number of survivor paths adopted $\Omega=4$, onward of the third iteration, the performance as regards bit error rate is much the same as that of the BCJR optimal decoding, substantially regardless of the value of the signal-to-noise ratio.

The decoding system according to the invention thus uses a suboptimal algorithm to carry out the multi-layer detection and intersymbol interference decoding operations, while advantageously reducing the complexity of the processing performed. Furthermore, it implements an iterative estimation of the coefficients of the impulse response of the transmission channels.

The coding and decoding process which is the subject of the present invention gives especially beneficial results as regards gain in bit error rate for wide ranges of values of the signal-to-noise ratio. It can furthermore be optimized as a function of the number of layers and of the number of survivor paths adopted.

We claim:

1. A method of decoding a digital data stream coded with bitwise interleaving in multiple transmission and reception on a transmission channel which creates intersymbol interference, the digital data stream coded with interleaving comprising a set of transmitted elementary digital streams obtained from an initial digital data stream subjected to:
   an outer coding by means of a code of specified rate, so as to generate a coded digital stream,
   an interleaving at bit level of this coded digital stream so as to generate an interleaved coded digital stream,
   a layer demultiplexing of this interleaved coded digital stream on a specified number $v$ of demultiplexed pathways, so as to generate a corresponding number of layers of interleaved coded digital stream,
   converting each digital modulation string consisting of $q_m$ successive bits of one and the same layer into a $Q_m$-ary symbol, $Q_m=2^{q_m}$, according to a specific mapping scheme,
   transmitting each $Q_m$-ary symbol by means of a distinct transmission antenna, the set of these antennas forming a space-diversity array, making it possible to generate this set of transmitted elementary digital streams,
wherein said method further comprises the steps of:
   receiving, on a plurality p of reception antennas, said digital data stream coded with bitwise interleaving in multiple transmission and reception consisting of said set of elementary digital streams transmitted on this transmission channel, there being a number p of said reception antennas, which number is independent of the number $v$ of transmission antennas and said reception antennas forming an array of space-diversity reception antennas so as to define a set of elementary streams of modulation symbols received;
   subjecting said set of elementary streams of modulation symbols received to an iterative process of equalization of the transmission channel and of joint multilayer detection by means of an extrinsic information stream on the bits coded by said outer code and interleaved, said extrinsic information stream constituting an a priori information item, so as to generate a first extrinsic information stream on the bits coded by the outer code and interleaved;
   subjecting said first extrinsic information stream to a deinterleaving, so as to generate a second extrinsic information stream on the coded bits originating from the equalization process;
   subjecting said second extrinsic information stream on the coded bits to a decoding on the basis of said outer code, so as to generate a third extrinsic information stream on the coded bits, which stream arises from the decoding on the basis of said outer code;
   subjecting said third extrinsic information stream to an interleaving, so as to generate said extrinsic information stream on the bits coded by said outer code and interleaved constituting said a priori information item;
   reinjecting said a priori information item into the iterative process of equalization of the transmission channel and of joint multilayer detection.

2. The method as claimed in claim 1, wherein said iterative process of equalization and of joint detection of the transmission channel comprises the steps of:
   subjecting said extrinsic information stream on the bits coded by said outer code and interleaved, constituting said a priori information item, to a layer demultiplexing into a set $v$ streams of a priori information on the bits of the layers of interleaved coded digital stream;
   performing, on said elementary streams of modulation symbols received, on the basis of said streams of a priori information on the bits of the layers, an equalization and a joint multilayer detection with weighted input/output applied to a global trellis reduced in terms of number of states, this trellis being defined as the trellis of the constituent elementary channels, with memory, of the transmission channel, so as to generate a set of streams of weighted outputs on the bits of layers of interleaved coded digital stream;
   extracting from each stream of weighted outputs on the layer bits said a priori information item on the layer bits, so as to generate a set of extrinsic information streams on the layer bits;
   subjecting the set of extrinsic information streams on the layer bits to a multiplexing, so as to generate said first extrinsic information stream on the bits coded by the outer code and interleaved.

3. The method as claimed in claim 1, wherein said decoding by said outer code comprises the steps of:
   subjecting said second extrinsic information stream on the coded bits originating from the equalization process to a weighted input/output decoding by means of said external code, so as to generate a stream of weighted outputs representative of an a posteriori information item on the coded bits;
   subtracting said second extrinsic information stream from said stream of weighted outputs representative of said a posteriori information item on the coded bits, so as to generate said third extrinsic information stream on the coded bits.

4. The method as claimed in claim 1, wherein, for a set of transmitted elementary digital streams which consists of bursts comprising at least one string of learning binary symbols, the method further comprises the steps of:
   calculating for each iteration on the basis of learning symbols an estimate of the coefficients of contribution to the intersymbol interference between constituent elementary channels of the transmission channel;

reinjecting into the equalization and joint multilayer detection process the reestimated values of these coefficients.

5. The method as claimed in claim 2, wherein the equalization and joint multilayer detection step with weighted input and output is implemented by the GPSP process, consisting in retaining Q survivors per node of the global reduced trellis, the calculation of said weighted outputs consisting of a generalized SOVA process.

6. The method as claimed in claim 2, wherein said global trellis results from a Cartesian product of reduced trellises in terms of number of states, associated with the channels.

7. A device for decoding a digital data stream coded with bitwise interleaving in multiple transmission and reception on a transmission channel which creates intersymbol interference, the digital data stream coded with interleaving comprising a digital data set subjected to:
an outer coding by means of a code of specified rate, so as to generate an interleaved coded digital stream,
a layer demultiplexing of the interleaved coded digital stream on a specified number v of demultiplexed pathways, so as to generate a corresponding number of layers of interleaved coded digital stream,
a conversion of each digital modulation string comprising $q_m$ successive bits of one and the same layer into a $Q_m$-ary symbol, $Q_m=2^{q_m}$, according to a specific mapping scheme,
a transmission of each $Q_m$-ary symbol by means of a distinct transmission antenna, the set of these antennas forming a space-diversity array, making it possible to generate this set of transmitted elementary digital streams,
wherein said decoding device comprises:
a plurality p of reception antennas making it possible to receive said digital data stream coded with bitwise interleaving in multiple transmission and reception comprising said set of elementary digital streams transmitted on the transmission channel, there being a number ρ of said reception antennas, which number is independent of the number v of transmission antennas and said reception antennas forming an array of space-diversity reception antennas so as to define a set of elementary streams of modulation symbols received;
turbodetection means making it possible to subject said set of elementary streams of modulation symbols received to an iterative process of equalization of the transmission channel and ofjoint multilayer detection by means of an extrinsic information stream on the bits coded by said outer code and interleaved, said extrinsic information stream constituting an a priori information item, so as to generate a first extrinsic information stream on the bits coded by the outer code and interleaved;
deinterleaving means receiving said first extrinsic information stream and making it possible, by deinterleaving the latter, to generate a second extrinsic information stream on the coded bits originating from the equalization process;
decoder means receiving said second extrinsic information stream on the coded bits and making it possible, by decoding the latter, on the basis of said outer code, to generate a third extrinsic information stream on the coded bits, which stream arises from the decoding on the basis of said outer code;
interleaving means receiving said third extrinsic information stream and making it possible, by interleaving, to generate said extrinsic information stream on the bits coded by said outer code and interleaved constituting said a priori information item;
means of reinjection of said a priori information item into the iterative process of equalization of the transmission channel and ofjoint multilayer detection.

8. The device as claimed in claim 7, wherein said turbo-detection means include means of channel equalization and joint detection comnrising:
layer demultiplexing means receiving said extrinsic information stream on the bits coded by said outer code and interleaved constituting said a priori information item making it possible, by demultiplexing on a number v of pathways, to generate a set v of a priori information streams on the bits of the layers of interleaved coded digital stream;
means of equalization and ofjoint multilayer detection receiving, on the one hand, said elementary streams of modulation symbols received, and, on the other hand, said a priori information streams on the bits of the layers, said means of equalization and ofjoint detection making it possible to perform an equalization and a joint multilayer detection with weighted input/output applied to a global trellis reduced in terms of number of states, this trellis being defined as the trellis of the constituent elementary channels, with memory, of the transmission channel, so as to generate a set of streams of weighted outputs on the bits of layers of interleaved coded digital stream;
means of extraction, from each stream of weighted outputs on the layer bits, of said a priori information item on the layer bits, making it possible to generate a set of extrinsic information streams on the layer bits;
multiplexer means receiving said set of extrinsic information streams on the layer bits and making it possible, by multiplexing, to generate said first extrinsic information stream on the bits coded by the outer code and interleaved.

9. The device as claimed in claim 7, wherein said decoder means compnse:
means of decoding with weighted input/output by means of said outer code receiving said second extrinsic information stream on the coded bits originating from the equalization process and making it possible to generate a stream of weighted outputs representative of an a posteriori information item on the coded bits;
subtractor means for subtracting said second extrinsic information stream from said stream of weighted outputs representative of said a posteriori information item on the coded bits, making it possible to generate said third extrinsic information stream on the coded bits.

10. The device as claimed in claim 7, wherein, for a set of transmitted elementary digital streams which consists of bursts comprising at least one string of learning binary symbols, the latter furthermore compnses means of calculation, for each iteration, on the basis of said learning symbols of an estimate of the coefficients of contribution to the intersymbol interference between constituent elementary channels of the transmission channel, the reestimated values of these coefficients being reinjected into the equalization and detection process.

11. The device as claimed in claim 8, wherein the equalization and joint multilayer detection means with weighted input and output are implemented according to a GPSP process, consisting in retaining Q survivors per node of the global reduced trellis, the calculation of said weighted outputs consisting of a generalized SOVA/SOVE type process.

* * * * *